(12) United States Patent
Byun et al.

(10) Patent No.: US 10,134,646 B2
(45) Date of Patent: Nov. 20, 2018

(54) DISPLAY DEVICE AND TESTING METHOD THEREOF

(71) Applicant: LG DISPLAY CO., LTD., Seoul (KR)

(72) Inventors: Hyuntae Byun, Gimpo-si (KR); Eunah Song, Seoul (KR); Junggi Kim, Seoul (KR); Kwang Nam Cho, Uijeongbu-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/385,255

(22) Filed: Dec. 20, 2016

(65) Prior Publication Data

US 2018/0061722 A1    Mar. 1, 2018

(30) Foreign Application Priority Data

Aug. 31, 2016   (KR) .................. 10-2016-0111737

(51) Int. Cl.
| | |
|---|---|
| *H01L 21/66* | (2006.01) |
| *H01L 51/52* | (2006.01) |
| *H01L 27/32* | (2006.01) |
| *H01L 51/56* | (2006.01) |
| *G09G 3/00* | (2006.01) |

(52) U.S. Cl.
CPC ............ *H01L 22/32* (2013.01); *G09G 3/006* (2013.01); *H01L 22/14* (2013.01); *H01L 27/326* (2013.01); *H01L 27/3246* (2013.01); *H01L 27/3276* (2013.01); *H01L 51/524* (2013.01); *H01L 51/5253* (2013.01); *H01L 51/56* (2013.01); *H01L 2251/5392* (2013.01); *H01L 2251/568* (2013.01)

(58) Field of Classification Search
None
See application file for complete search history.

(56) References Cited

U.S. PATENT DOCUMENTS

| | | | |
|---|---|---|---|
| 7,907,329 B2 | 3/2011 | Lee et al. | |
| 2003/0164674 A1* | 9/2003 | Imamura | H05B 33/04 313/493 |
| 2004/0125307 A1 | 7/2004 | Lee et al. | |
| 2011/0141717 A1 | 6/2011 | Yoshinaga | |
| 2015/0060806 A1 | 3/2015 | Park et al. | |

(Continued)

FOREIGN PATENT DOCUMENTS

| | | |
|---|---|---|
| CN | 101762925 A | 6/2010 |
| CN | 105895827 A | 8/2016 |

(Continued)

*Primary Examiner* — Shaun Campbell
(74) *Attorney, Agent, or Firm* — Seed Intellectual Property Law Group LLP

(57) ABSTRACT

A display device and a testing method thereof are disclosed, in which a defect caused by an overflow of an organic film constituting an encapsulation film can be detected. The display device comprises a substrate including a display area where pixels are arranged, and a pad area including a plurality of pads formed outside the display area; an encapsulation film covering the display area, including at least one inorganic film and at least one organic film; a dam arranged between the display area and the pad area; and a conductive testing line arranged between the dam and the pad area and not electrically connected with another conductive line or electrode arranged on the substrate.

9 Claims, 15 Drawing Sheets

(56) References Cited

U.S. PATENT DOCUMENTS

| | | | |
|---|---|---|---|
| 2015/0171367 A1 | 6/2015 | Moon | |
| 2015/0255527 A1* | 9/2015 | Oooka | H01L 22/32 |
| | | | 257/88 |
| 2015/0380685 A1* | 12/2015 | Lee | H01L 51/5243 |
| | | | 257/40 |
| 2016/0043340 A1 | 2/2016 | Ohara | |
| 2016/0204373 A1 | 7/2016 | Park | |
| 2016/0307971 A1* | 10/2016 | Jeon | H01L 27/3258 |

FOREIGN PATENT DOCUMENTS

| | | |
|---|---|---|
| JP | 2001-230076 A | 8/2001 |
| JP | 2003-323974 A | 11/2003 |
| JP | 2011/124160 A | 6/2011 |
| JP | 2012-253036 A | 12/2012 |

* cited by examiner

DISPLAY DEVICE AND TESTING METHOD THEREOF

CROSS REFERENCE TO RELATED APPLICATIONS

This application claims the benefit of the Korean Patent Application No. 10-2016-0111737 filed on Aug. 31, 2016, which is hereby incorporated by reference for all purposes as if fully set forth herein.

BACKGROUND

Technical Field

The present disclosure relates to a display device and a testing method thereof.

Discussion of the Related Art

Recently, with the advancement of the information age, a demand for a display device for displaying an image has been increased in various forms. Therefore, various display devices such as liquid crystal display (LCD) devices, plasma display panel (PDP) devices, and organic light emitting display (OLED) devices have been used.

Among the display devices, the organic light emitting display device is a self-light emitting device, and has advantages in that a viewing angle and a contrast ratio are more excellent than those of the liquid crystal display device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

The organic light emitting display device includes pixels, each of which includes an organic light emitting diode, and a bank partitioning the pixels to define the pixels. The bank may serve as a pixel definition film. The organic light emitting diode includes an anode electrode, a hole transporting layer, an organic light emitting layer, an electron transporting layer, and a cathode electrode. In this case, if a high potential voltage is applied to the anode electrode and a low potential voltage is applied to the cathode electrode, holes and electrons are moved to the organic light emitting layer through the hole transporting layer and the electron transporting layer, respectively, and are combined with each other in the organic light emitting layer to emit light.

The organic light emitting diode has a problem in that the organic light emitting diode is likely to be degraded due to external factors such as external $H_2O$ and $O_2$. To prevent such a problem from occurring, the organic light emitting device includes an encapsulation film formed to prevent external $H_2O$ and $O_2$ from being permeated into the organic light emitting diode.

FIG. 1 is a cross-sectional view briefly illustrating a display device of the related art.

Referring to FIG. 1, in the display device of the related art, an encapsulation film 30 is formed on a substrate 10 provided with an organic light emitting diode 20. At this time, the encapsulation film 30 includes a first inorganic film 30a, an organic film 30b, and a second inorganic film 30c to prevent $O_2$ or $H_2O$ from being permeated into an organic light emitting layer and an electrode.

The organic film 30b is formed on the first inorganic film 30a to cover the first inorganic film 30a, thereby preventing particles from being permeated into the organic light emitting layer and the electrode by passing through the first inorganic film 30a.

The organic film 30b is generally made of a polymer, and is deposited on the substrate 10 in a liquid form and then formed through a hardening process. Since the organic film 30b has flexibility until the hardening process is performed, the organic film 30b may overflow outside an area where the encapsulation film 30 is to be formed.

If the organic film 30b overflows towards a pad portion formed at the outside, electric contact is not made due to the organic film 30b, whereby a problem occurs in that a driving defect or a lighting test defect may occur.

Meanwhile, since the organic film 30b has excellent coating performance but its barrier performance is not good, the organic film 30b should be encapsulated by the second inorganic film 30c. However, if the organic film 30b overflows outside the area where the encapsulation film 30 is to be formed, the organic film 30b is not encapsulated by the second inorganic film 30c as shown in FIG. 2, and $H_2O$, $O_2$, etc. are permeated into the organic light emitting layer through the exposed organic film 30b, whereby another problem occurs in that the organic light emitting diode 20 is degraded.

As described above, although various problems occur if the organic film 30b overflows outside the area where the encapsulation film 30 is to be formed, since the polymer which is a material of the organic film 30b is transparent, other problem occurs in that a defect cannot be detected by the naked eye.

BRIEF SUMMARY

Accordingly, the present disclosure is directed to a display device and a testing method thereof, which substantially reduces one or more problems due to limitations and disadvantages of the related art.

An advantage of the present disclosure is to provide a display device and a testing method thereof, in which a defect caused by an overflow of an organic film can be detected.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device comprises a substrate including a display area where pixels are arranged, and a pad area including a plurality of pads formed outside the display area; an encapsulation film covering the display area, including at least one inorganic film and at least one organic film; a dam arranged between the display area and the pad area; and a conductive testing line arranged between the dam and the pad area and not electrically connected with another conductive line or electrode arranged on the substrate.

In another aspect of the present disclosure, a testing method of a display device comprises the steps of forming pixels on a display area on a substrate, forming a plurality of pads on a pad area, forming a dam between the display area and the pad area, and forming a conductive testing line between the dam and the pad area; forming a first inorganic film covering the display area; forming an organic film covering the first inorganic film; applying an electric signal to at least two points of the conductive testing line and measuring a current or resistance between the two points; and determining a defect if the current or resistance between the two points is a threshold value or less.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
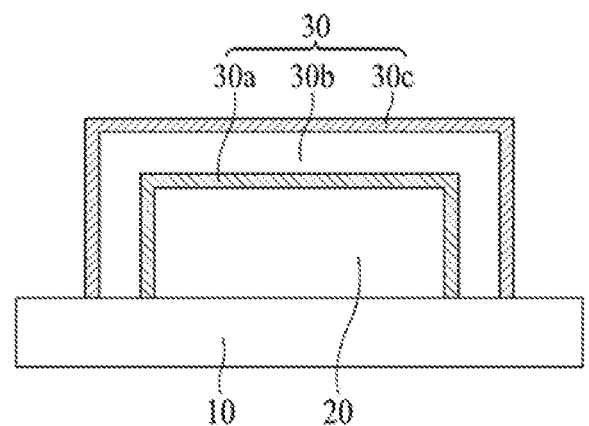
FIG. 1 is a cross-sectional view briefly illustrating a display device of the related art.
Figure 2:
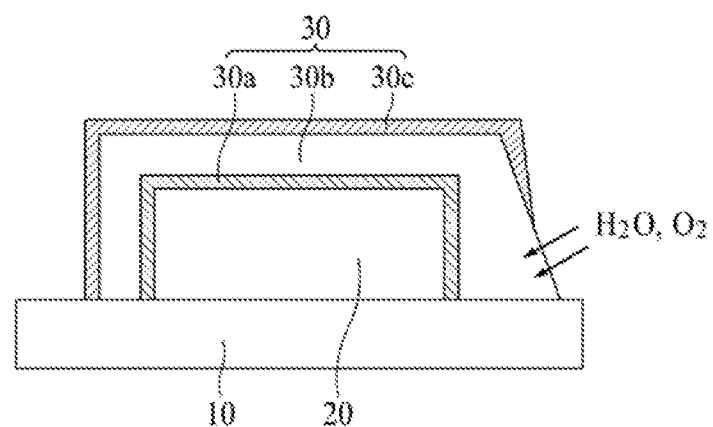
FIG. 2 is a cross-sectional view illustrating an organic film which overflows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present invention is only defined by scopes of claims.

A shape, a size, a ratio, an angle, and a number disclosed in the drawings for describing embodiments of the present disclosure are merely exemplary, and thus, the present disclosure is not limited to the illustrated details. Like reference numerals refer to like elements throughout the specification. When a detailed description of a known function or configuration is determined to unnecessarily obscure the description of the various embodiments of the present disclosure, then such detailed description will be omitted.

In a case where 'comprise', 'have', and 'include' described in the present specification are used, another part may be added unless 'only' is used. The terms of a singular form may include plural forms unless referred to the contrary.

In construing an element, the element is to be construed as including some tolerance or range for errors, although there is no explicit description.

In describing a position relationship, for example, when the position relationship is described as 'upon', 'above', 'below', and 'next to', one or more portions may be arranged between two other portions unless further limiting words, such as 'just' or 'direct', are expressly added to exclude such meaning.

In describing a time relationship, for example, when the temporal order is described as 'after', 'subsequent', 'next', and 'before', a case which is not continuous may be included unless further limiting words are expressly added, such as 'just' or 'direct.'

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings.

Figure 3:
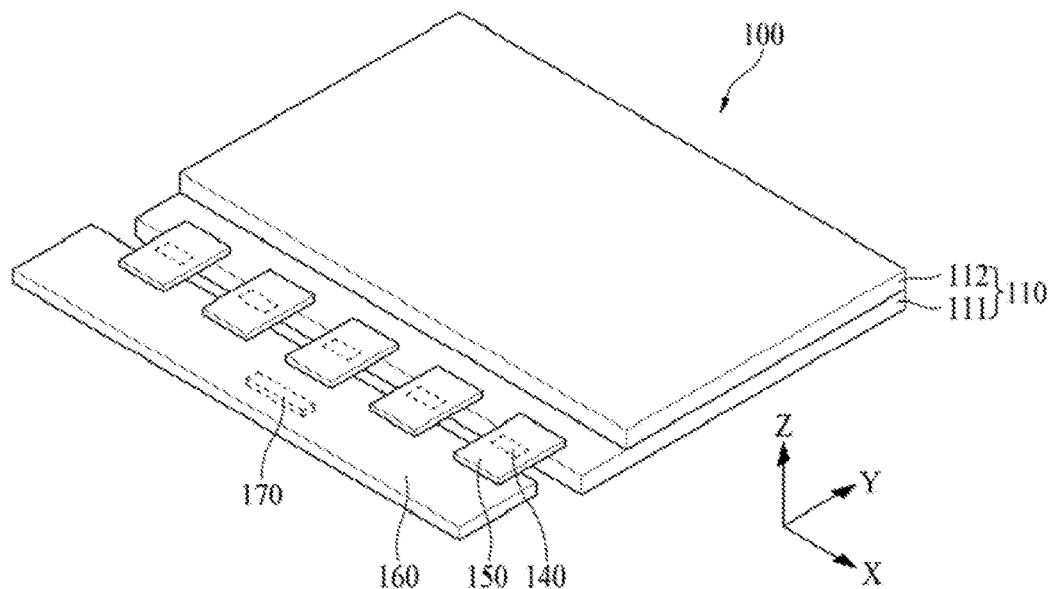
FIG. 3 is a perspective view illustrating a display device according to one or more embodiments of the present disclosure.
Figure 4:
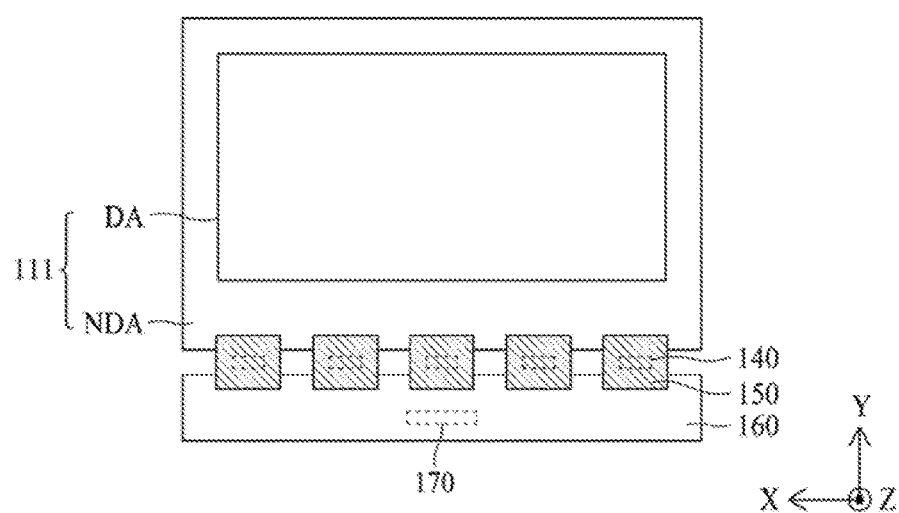
FIG. 4 is a plane view illustrating a first substrate, a source drive IC, a flexible film, a circuit board, and a timing controller of FIG. 3.

FIG. 3 is a perspective view illustrating a display device according to one or more embodiments of the present disclosure, and FIG. 4 is a plane view illustrating a first substrate, a source drive IC, a flexible film, a circuit board, and a timing controller of FIG. 3. Hereinafter, the display device according to embodiments of the present disclosure will be described as, but is not limited to, an organic light emitting display device. That is, the display device according to one or more alternative embodiments of the present disclosure may be realized as any one of a liquid crystal display device, a field emission display device and an electrophoresis display device.

Referring to FIGS. 3 and 4, the display device 100 according to one or more embodiments of the present disclosure includes a display panel 110, a source drive integrated circuit (hereinafter, referred to as "IC") 140, a flexible film 150, a circuit board 160, and a timing controller 170.

The display panel 110 includes a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film.

Gate lines, data lines and pixels are formed on one surface of the first substrate 111, which faces the second substrate 112. The pixels are provided in an area defined by a crossing structure of the gate lines and the data lines.

Each of the pixels may include an organic light emitting diode that includes a thin film transistor, a first electrode, an organic light emitting layer, and a second electrode. Each of the pixels supplies a predetermined current to the organic light emitting diode in accordance with a data voltage of the data line if a gate signal is input from the gate line by using the thin film transistor. For this reason, the organic light emitting diode of each of the pixels may emit light with a predetermined brightness in accordance with the predetermined current. A structure of each of the pixels will be described later with reference to FIGS. 5 and 6.

The display panel 110 may be categorized into a display area DA where the pixels are formed to display an image and a non-display area NDA where an image is not displayed, as shown in FIG. 4. The gate lines, the data lines and the pixels may be formed on the display area DA. A gate driver and pads may be formed on the non-display area NDA.

The gate driver supplies gate signals to the gate lines in accordance with a gate control signal input from the timing controller 170. The gate driver 20 may be formed on the non-display area NDA outside one side or both sides of the display area DA of the display panel 110 in a gate driver in panel (GIP) mode. Alternatively, the gate driver may be fabricated of a driving chip, packaged in a flexible film and attached to the non-display area NDA outside one side or both sides of the display panel 10 in a tape automated bonding (TAB) mode.

The source drive IC 140 receives digital video data and a source control signal from the timing controller 170. The source drive IC 140 converts the digital video data to analog data voltages in accordance with the source control signal and supplies the analog data voltages to the data lines. If the source drive IC 140 is fabricated of a driving chip, the source drive IC 140 may be packaged in the flexible film 150 in a chip on film (COF) or chip on plastic (COP) mode.

Pads such as data pads may be formed on the non-display area NDA of the display panel 110. Lines which connect the pads with the source drive IC 140 and lines which connect the pads with the circuit board 160 may be formed in the flexible film 150. The flexible film 150 is attached onto the pads by using an anisotropic conducting film, whereby the pads may be connected with the lines of the flexible film 150.

The circuit board 160 may be attached to the flexible films 150. A plurality of circuits comprised of driving chips may be packaged in the circuit board 160. For example, the timing controller 170 may be packaged in the circuit board 160. The circuit board 160 may be a printed circuit board or a flexible printed circuit board.

The timing controller 170 receives digital video data and a timing signal from an external system board through a cable. The timing controller 170 generates a gate control signal for controlling an operation timing of the gate driver and a source control signal for controlling the source drive ICs 140 on the basis of the timing signal. The timing controller 170 supplies the gate control signal to the gate driver, and supplies the source control signal to the source drive ICs 140.

Figure 5:
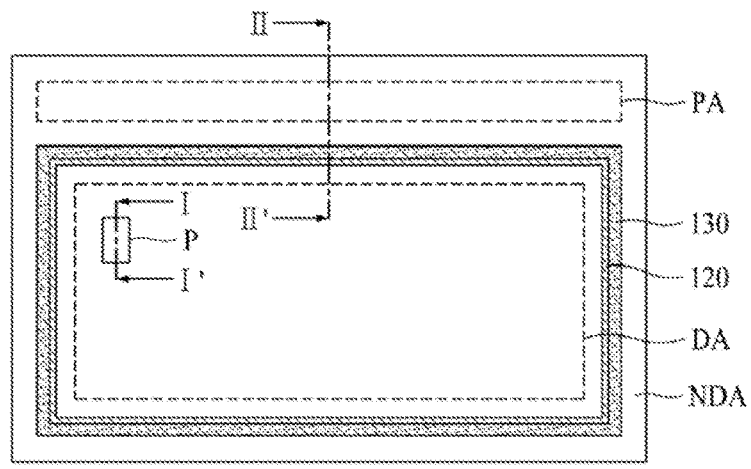
FIG. 5 is a plane view briefly illustrating a first substrate of FIG. 4.

FIG. 5 is a plane view briefly illustrating a first substrate of FIG. 4.

Referring to FIG. 5, the first substrate 111 is categorized into the display area DA and the non-display area NDA, wherein a pad area PA where pads are formed, a dam 120 and a conductive testing line 130 may be formed on the non-display area NDA.

Pixels P for displaying an image are formed on the display area DA. Each of the pixels may include an organic light emitting diode that includes a thin film transistor, a first electrode, an organic light emitting layer, and a second electrode. Each of the pixels supplies a predetermined current to the organic light emitting diode in accordance with the data voltage of the data line if the gate signal is input from the gate line by using the thin film transistor. For this reason, the organic light emitting diode of each of the pixels may emit light with a predetermined brightness in accordance with the predetermined current.

Hereinafter, a structure of each of the pixels P of the display area DA according to the embodiments of the present disclosure will be described in detail with reference to FIG. 6.

Figure 6:
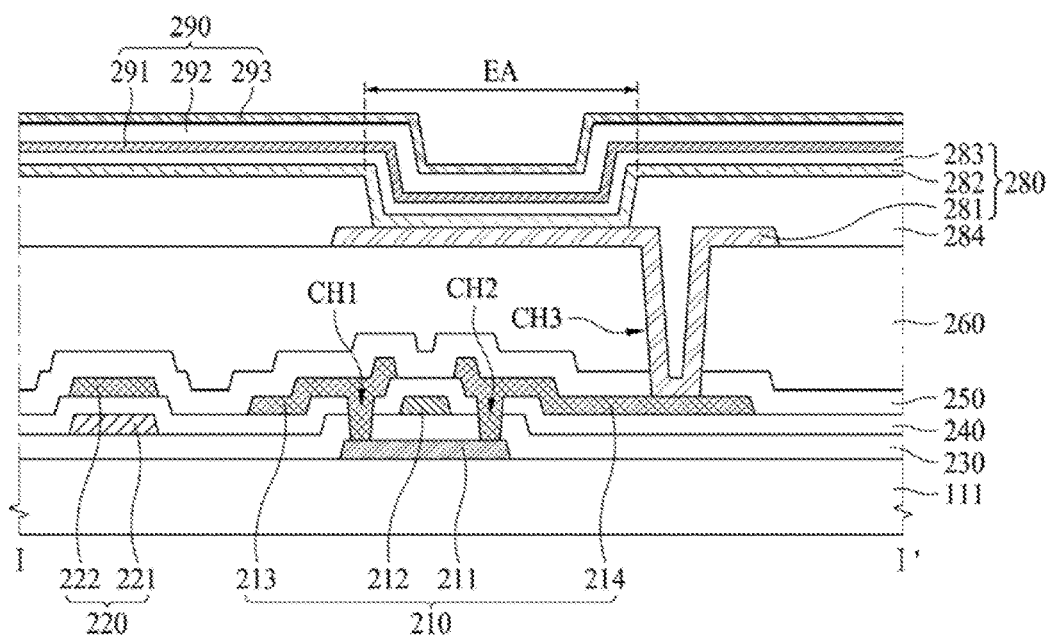
FIG. 6 is a cross-sectional view illustrating an example of a pixel of a display area of FIG. 5.

FIG. 6 is a cross-sectional view illustrating an example of the pixel P of the display area of FIG. 5.

Referring to FIG. 6, thin film transistors 210 and capacitors 220 are formed on one surface of the first substrate 111, which faces the second substrate 112.

A buffer film may be formed on the first substrate 111 to protect the thin film transistors 210 from $H_2O$ permeated through the first substrate 111 which is vulnerable to moisture permeability.

Each of the thin film transistors 210 includes an active layer 211, a gate electrode 212, a source electrode 213, and a drain electrode 214. Although the thin film transistors 210 are formed in a top gate mode in such a manner that the gate electrode 212 is arranged above the active layer 211 as shown in FIG. 6, it is to be understood that the thin film transistors of the present disclosure are not limited to the top gate mode. That is, the thin film transistors 210 may be formed in a bottom gate mode in which the gate electrode 212 is arranged below the active layer 211 or a double gate mode in which the gate electrode 212 is arranged above and below the active layer 211.

The active layer 211 is formed on the buffer film of the first substrate 110. The active layer 211 may be formed of a silicon based semiconductor material or an oxide based semiconductor material. A light-shielding layer for shielding external light entering the active layer 211 may be formed on the first substrate 110.

A gate insulating film 230 may be formed on the active layer 211. The gate insulating film 230 may be formed of an inorganic film, for example, a silicon oxide film, a silicon nitride film or a multi-layered film of the silicon oxide film and the silicon nitride film.

The gate electrode 212 may be formed on the gate insulating film 230. The gate electrode 212 may be, but not limited to, a single layer or multi-layer comprised of any one of Mo, Al, Cr, Au, Ti, Ni, Nd and Cu or their alloy.

A dielectric inter-layer 240 may be formed on the gate electrode 212. The dielectric inter-layer 240 may be formed of an inorganic film, for example, a silicon oxide film, a silicon nitride film, or a multi-layered film of the silicon oxide film and the silicon nitride film.

The source electrode 213 and the drain electrode 214 may be formed on the dielectric inter-layer 240. Each of the source electrode 213 and the drain electrode 214 may be connected to the active layer 211 through contact holes CH1 and CH2 that pass through the gate insulating film 230 and the dielectric inter-layer 240. Each of the source electrode 213 and the drain electrode 214 may be, but not limited to, a single layer or multi-layer comprised of any one of Mo, Al, Cr, Au, Ti, Ni, Nd and Cu or their alloy.

Each of the capacitors 220 includes a lower electrode 221 and an upper electrode 222. The lower electrode 221 is formed on the gate insulating film 230, and may be formed of the same material as that of the gate electrode 212. The upper electrode 222 is formed on the dielectric inter-layer 240, and may be formed of the same material as that of the source electrode 213 and the drain electrode 214.

A passivation film 250 may be formed on the thin film transistor 210 and the capacitor 220. The passivation film 250 may serve as an insulating film. The passivation film 250 may be formed of an inorganic film, for example, a silicon oxide film, a silicon nitride film, or a multi-layered film of the silicon oxide film and the silicon nitride film.

A planarization film 260 for planarizing a step difference due to the thin film transistor 210 and the capacitor 220 may be formed on the passivation layer 250. The planarization film 260 may be formed of an organic film such as acrylic resin, epoxy resin, phenolic resin, polyamide resin, and polyimide resin.

An organic light emitting diode 280 and a bank 284 are formed on the planarization film 260. The organic light emitting diode 280 includes a first electrode 283, an organic light emitting layer 282, and a second electrode 281. The first electrode 283 may be a cathode electrode, and the second electrode 281 may be an anode electrode. An area where the first electrode 283, the organic light emitting layer 283 and the second electrode 281 are deposited may be defined as an emission area (EA).

The second electrode 281 may be formed on the planarization film 260. The second electrode 281 is connected to the drain electrode 214 of the thin film transistor 210 through a contact hole CH3 that passes through the passivation film 250 and the planarization film 260. The second electrode 281 may be formed of a metal material having high reflectivity such as a deposition structure (Ti/Al/Ti) of Al and Ti, a deposition structure (ITO/Al/ITO) of Al and ITO, an APC alloy, and a deposition structure (ITO/APC/ITO) of APC alloy and ITO. The APC alloy is an alloy of Ag, Pd and Cu.

The bank 284 may be formed on the planarization film 260 to cover an edge of the second electrode 281, thereby partitioning the emission areas EA. The bank 284 may be formed of an organic film such as acrylic resin, epoxy resin, phenolic resin, polyamide resin, and polyimide resin.

The organic light emitting layer 282 is formed on the second electrode 281 and the bank 284. The organic light emitting layer 282 may include a hole transporting layer, at least one light emitting layer, and an electron transporting layer. In this case, if a voltage is applied to the second electrode 281 and the first electrode 283, holes and electrons are moved to the light emitting layer through the hole transporting layer and the electron transporting layer, respectively, and are combined with each other in the light emitting layer to emit light.

The organic light emitting layer 282 may be comprised of a white light emitting layer emitting white light. In this case, the organic light emitting layer 282 may be formed to cover the second electrode 281 and the bank 284. In this case, a color filter (not shown) may be formed on the second substrate 112.

Alternatively, the organic light emitting layer 282 may be comprised of a red light emitting layer emitting red light, a green light emitting layer emitting green light, and a blue light emitting layer emitting blue light. In this case, the organic light emitting layer 282 may be formed in an area corresponding to the second electrode 281, and a color filter may not be formed on the second substrate 112.

The first electrode 283 is formed on the organic light emitting layer 282. If the organic light emitting display device is formed in a top emission structure, the first electrode 283 may be formed of a transparent conductive material (TCO) such as ITO and IZO, which may transmit light, or a semi-transmissive conductive material such as Mg, Ag, or alloy of Mg and Ag. A capping layer may be formed on the first electrode 283.

An encapsulation film 290 is formed on the organic light emitting diode 280. The encapsulation film 290 serves to prevent $H_2O$ or $O_2$ from being permeated into the organic light emitting layer 282 and the first electrode 283. To this end, the encapsulation film 290 may include at least one inorganic film and at least one organic film.

For example, the encapsulation film 290 may include a first inorganic film 291, an organic film 292, and a second inorganic film 293. In this case, the first inorganic film 291 is formed to cover the first electrode 283. The organic film 292 is formed to cover the first inorganic film 291. The organic film 292 is preferably formed at a sufficient thickness to prevent particles from being permeated into the organic light emitting layer 282 and the first electrode 283 by passing through the first inorganic film 291. The second inorganic film 293 is formed to cover the organic film 292.

First to third color filters (not shown) and a black matrix (not shown) may be formed on the encapsulation film 290. A red color filter may be formed on a red emission area, a blue color filter may be formed on a blue emission area, and a green color filter may be formed on a green emission area.

The encapsulation film 290 of the first substrate 111 and the color filters (not shown) of the second substrate 112 are adhered to each other using an adhesive layer (not shown), whereby the first substrate 111 and the second substrate 112 may be bonded to each other. The adhesive layer may be a transparent adhesive resin.

Referring to FIG. 5 again, the pad area PA may be arranged at an edge of one side of the first substrate 111. The pad area PA includes a plurality of pads, which may electrically be connected with lines of the flexible film 150 by using an anisotropic conducting film.

The dam 120 is arranged between the display area DA and the pad area PA to shield a flow of the organic film 292, thereby preventing the organic film 292 constituting the encapsulation film 290 of the pixel P from being permeated into the pad area PA.

The conductive testing line 130 is arranged between the pad area PA and the dam 120 and used to detect an overflow of the organic film 292 constituting the encapsulation film 290 of the pixel P.

Hereinafter, the dam and the conductive testing line according to embodiments of the present disclosure will be described in detail with reference to FIG. 7.

Figure 7:
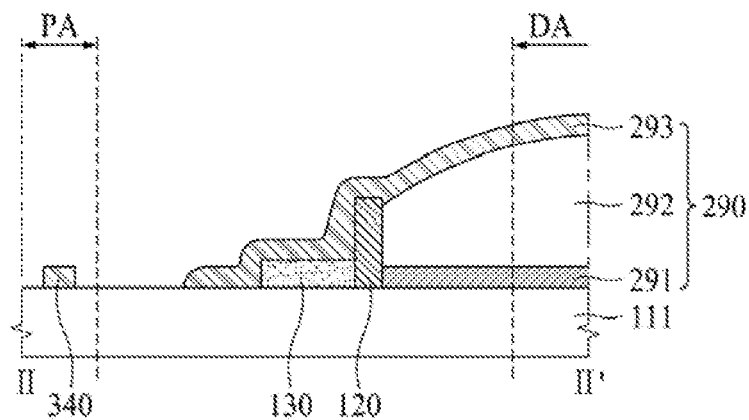
FIG. 7 is a cross-sectional view illustrating an example of a dam and a conductive testing line of FIG. 5.

FIG. 7 is a cross-sectional view illustrating an example of the dam and the conductive testing line of FIG. 5.

The display device shown in FIG. 7 includes an encapsulation film 290 formed on the first substrate 111, a dam 120, and a conductive testing line 130. At this time, the first substrate 111 includes a display area DA where pixels P are formed, and a pad area PA where a plurality of pads 340 are formed.

The encapsulation film 290 is formed to cover the organic light emitting diode 280 formed on the display area DA as shown in FIG. 6, and prevents H$_2$O and O$_2$ from being permeated into the organic light emitting diode 280. At this time, the encapsulation film 290 includes at least one inorganic film and at least one organic film. For example, the encapsulation film 290 may include a first inorganic film 291, an organic film 292, and a second inorganic film 293. In this case, the first inorganic film 291 is formed to cover the first electrode 283. The organic film 292 is formed to cover the first inorganic film 291, and the second inorganic film 293 is formed to cover the organic film 292.

Each of the first and second inorganic films 291 and 293 may be formed of a silicon nitride, an aluminum nitride, a zirconium nitride, a titanium nitride, a hafnium nitride, a tantalum nitride, silicon nitride, an aluminum oxide, or a titanium oxide.

The organic film 292 may be formed transparently to transmit light emitted from the organic light emitting layer 282. The organic film 292 may be formed of an organic material, which may transmit light emitted from the organic light emitting layer 282 at 99% or more, for example, acrylic resin, epoxy resin, phenolic resin, polyamide resin, or polyimide resin.

The dam 120 is arranged between the display area DA and the pad area PA to shield a flow of the organic film 292, thereby preventing the organic film 292 constituting the encapsulation film 290 from being permeated into the pad area PA. The dam 120 may be formed only between the display area DA and the pad area PA, or may be formed to surround the outside of the display area DA as shown in FIG. 5. As a result, the dam 120 may prevent the organic film 292 from being permeated into the pad area PA or from being exposed to the outside of the display device.

Figure 8:
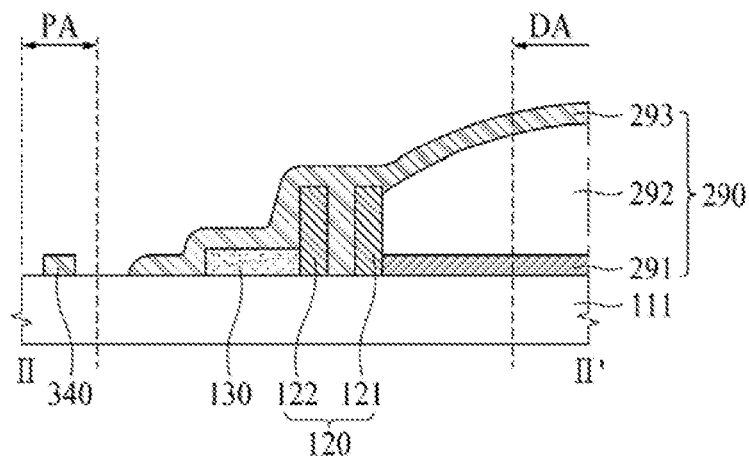
FIG. 8 is a plane view illustrating another example of a first substrate of FIG. 4.

Although one dam 120 is shown in FIG. 7, the present disclosure is not limited to the example of FIG. 7. In another embodiment, the dam 120 may include a first dam 121 and a second dam 122 spaced apart from the first dam 121 and arranged between the first dam 121 and the pad area PA as shown in FIG. 8.

The dam 120 may be formed simultaneously with the planarization film 260 or the bank 284 of the pixel P, and may be formed of the same material as that of the planarization film 260 or the bank 284. In this case, the dam 120 may be formed of an organic material such as acrylic resin, epoxy resin, phenolic resin, polyamide resin, and polyimide resin.

The conductive testing line 130 is arranged between the dam 120 and the pad area PA, and is not electrically connected with another conducting line or electrode arranged on the first substrate 111. In this case, another conducting line includes gate lines and data lines formed on the first substrate 111, and the electrode includes, but is not limited to, a source electrode, a drain electrode, an anode electrode and a cathode electrode, which are formed on the first substrate 111. That is, the conductive testing line 130 is electrically isolated with respect to the other conducting lines and/or electrodes arranged on the first substrate 111.

The conductive testing line 130 is used to detect an overflow of the organic film 292 that may occur during formation of the organic film 292 and the second inorganic film 293. After the organic film 292 is formed, an external measurement device (not shown) may apply an electric signal to two points of the conductive testing line 130 by using a probe, and may measure a current or resistance between the two points.

At this time, if the measured current or resistance is equal to or less than a threshold value, since the organic film 292 overflows to reach the outside of the dam 120 and is formed on the conductive testing line 130, a defect may be determined. In this way, in the present disclosure, the current or resistance between the two points of the conductive testing line 130 is measured, and the overflow of the organic film 292 is determined based on the measured current or resistance. To exactly determine the overflow of the organic film 292, it is preferable that the first inorganic film 291 does not cover the conductive testing line 130. This is because that the current or resistance between the two points of the conductive testing line 130 may be always measured at a threshold value or less if the first inorganic film 291 is formed to cover the conductive testing line 130.

Meanwhile, if the measured current or resistance exceeds a threshold value, the corresponding display device may be determined as a good product (i.e., with no overflow of the organic film 292). A detailed description of a method for testing a defect using the conductive testing line 130 will be described later with reference to FIG. 14.

The conductive testing line 130 may be formed only between the dam 120 and the pad area PA, or may be formed to surround the outside of the display area DA as shown in FIG. 5.

The conductive testing line 130 may be formed simultaneously with the first electrode 283 or the second electrode 281 of the pixel P, and may be formed of the same material as that of the first electrode 283 or the second electrode 281. In this case, the conductive testing line 130 may be formed of a transparent conductive material (TCO) such as ITO and IZO, or a semi-transmissive conductive material such as Mg, Ag, or alloy of Mg and Ag. In the present disclosure, the conductive testing line 130 is formed simultaneously with the first electrode 283 or the second electrode 281, whereby the conductive testing line 130 may be formed without adding a separate manufacturing process.

Meanwhile, the conductive testing line 130 may not be formed simultaneously with the first electrode 283 or the second electrode 281. In this case, since the conductive testing line 130 is formed on the non-display area NDA, the conductive testing line 130 is not required to be formed of a metal material, which transmits light, such as the first electrode 283 or the second electrode 281, and may be formed of a conductive material that flows electricity.

In the present disclosure, the dam 120 is formed between the display area DA and the pad area PA, whereby the organic film 292 having flexibility may be prevented from being permeated into the pad area PA. Also, in the present disclosure, the conductive testing line 130 is formed between the dam 120 and the pad area PA, whereby overflow of the organic film 292 may be detected using the conductive testing line 130. Therefore, in the present disclosure, degradation of the organic light emitting diode 280, which is caused as the organic film 292 is exposed without being fully covered by the second inorganic film 293, may be avoided, and reliability of the product may be improved through exact detection of a defect.

Meanwhile, in the present disclosure, since the first inorganic film 291 is formed not to cover the conductive testing line 130, the overflow of the organic film 292 may be detected exactly. Also, in the present disclosure, the second inorganic film 293 is formed to cover the dam 120 and the conductive testing line 130, whereby $H_2O$, $O_2$, etc. may be prevented from being permeated into the organic film 292.

Figure 9:
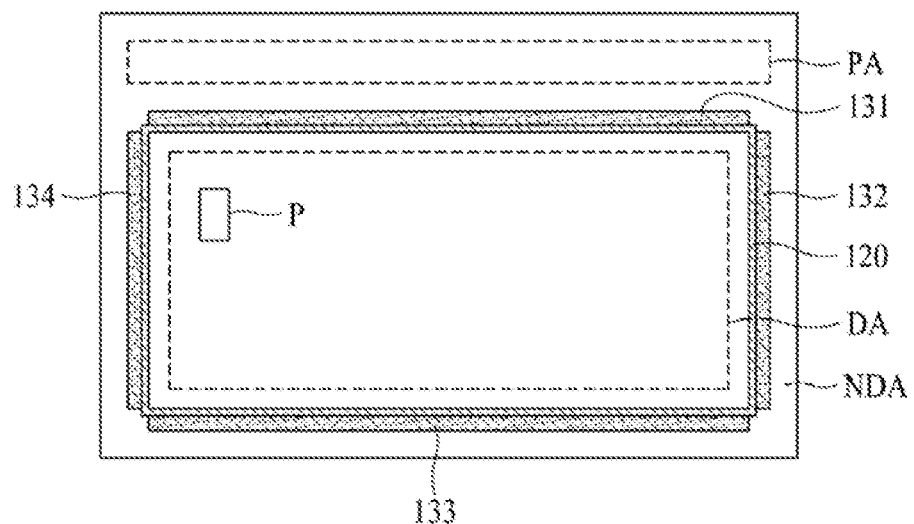
FIG. 9 is a plane view illustrating still another example of a first substrate of FIG. 4.

FIG. 9 is a plane view illustrating another example of the first substrate of FIG. 4.

Referring to FIG. 9, the first substrate 111 is categorized into the display area DA and the non-display area NDA, wherein the pad area PA where pads are formed, the dam 120 and the conductive testing line 130 may be formed on the non-display area NDA. In this case, the first substrate 111 shown in FIG. 9 is different from the first substrate shown in FIG. 5 in that the conductive testing line 130 includes a plurality of conductive testing lines.

The dam 120 is arranged to surround four sides of the display area DA, thereby shielding a flow of the organic film 292 constituting the encapsulation film 290 of the pixel P. As a result, the dam 120 prevents the organic film 292 from being permeated into the pad area PA and at the same time prevents the organic film 292 from being exposed to the outside of the display device.

The conductive testing line 130 includes first to fourth conductive testing lines 131, 132, 133 and 134 respectively arranged at the four sides of the display area DA. At this time, the first to fourth conductive testing lines 131, 132, 133 and 134 are spaced apart from one another and are not electrically connected with one another.

Each of the first to fourth conductive testing lines 131, 132, 133 and 134 is arranged at the outside of the dam 120 and used to detect that the organic film 292 constituting the encapsulation film 290 of the pixel P overflows outside the dam 120.

Figure 10:
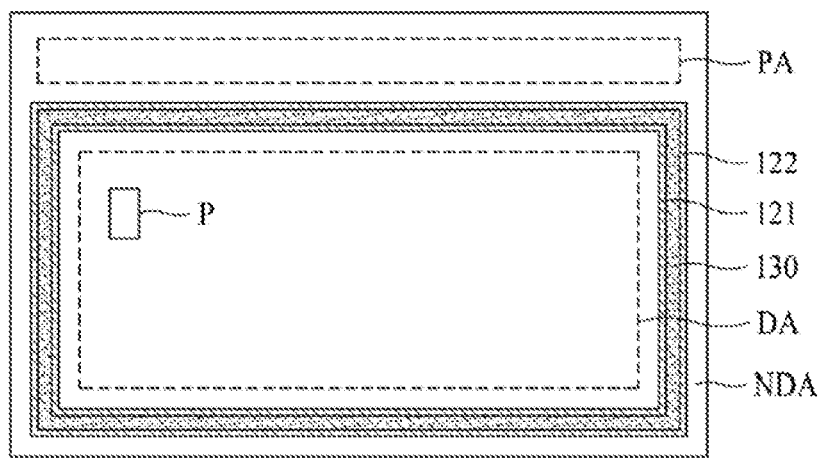
FIG. 10 is a plane view illustrating further still another example of a first substrate of FIG. 4.

FIG. 10 is a plane view illustrating still another example of the first substrate of FIG. 4.

Referring to FIG. 10, the first substrate 111 is categorized into the display area DA and the non-display area NDA, wherein the pad area PA where pads are formed, the dam 120 and the conductive testing line 130 may be formed on the non-display area NDA. In this case, the first substrate 111 shown in FIG. 10 is different from the first substrate shown in FIG. 5 in that the conductive testing line 130 is arranged between a plurality of dams.

The dam 120 includes a first dam 121 and a second dam 122 arranged between the first dam 121 and the pad area PA. The first and second dams 121 and 122 are arranged only between the display area DA and the pad area PA, and are arranged to surround the outside of the display area DA, thereby shielding the flow of the organic film 292 constituting the encapsulation film 290 of the pixel P. As a result, the first and second dams 121 and 122 may prevent the organic film 292 from being permeated into the pad area PA or prevent the organic film 292 from being exposed to the outside of the display device.

The conductive testing line 130 is arranged between the first dam 121 and the second dam 122 and used to detect that the organic film 292 constituting the encapsulation film 290 of the pixel P overflows.

Figure 11:
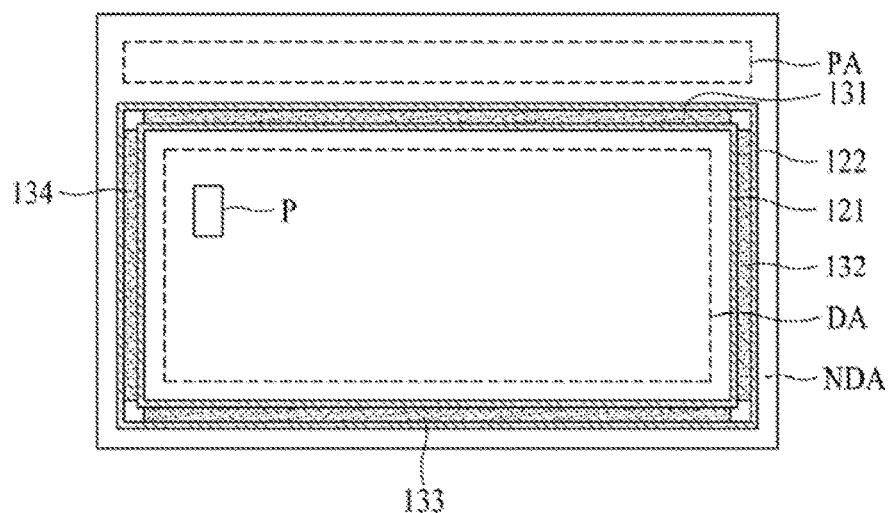
FIG. 11 is a plane view illustrating further still another example of a first substrate of FIG. 4.

FIG. 11 is a plane view illustrating further still another example of the first substrate of FIG. 4.

Referring to FIG. 11, the first substrate 111 is categorized into the display area DA and the non-display area NDA, wherein the pad area PA where pads are formed, the dam 120 and the conductive testing line 130 may be formed on the non-display area NDA. In this case, the first substrate 111 shown in FIG. 11 is different from the first substrate shown in FIG. 5 in that the dam 120 includes a plurality of dams and a plurality of conductive testing lines 130 are arranged between the plurality of dams.

The dam 120 includes a first dam 121 and a second dam 122 arranged between the first dam 121 and the pad area PA. The first and second dams 121 and 122 are arranged only between the display area DA and the pad area PA, or are arranged to surround four sides of the display area DA, thereby shielding the flow of the organic film 292 constituting the encapsulation film 290 of the pixel P. As a result, the first and second dams 121 and 122 may prevent the organic film 292 from being permeated into the pad area PA or prevent the organic film 292 from being exposed to the outside of the display device.

The conductive testing line 130 includes first to fourth conductive testing lines 131, 132, 133 and 134 respectively arranged at the four sides of the display area DA. At this time, the first to fourth conductive testing lines 131, 132, 133 and 134 are spaced apart from one another and are not electrically connected with one another.

Each of the first to fourth conductive testing lines 131, 132, 133 and 134 is arranged between the first dam 121 and the second dam 122 and used to detect that the organic film 292 constituting the encapsulation film 290 of the pixel P overflows outside the dam 120.

Figure 12:
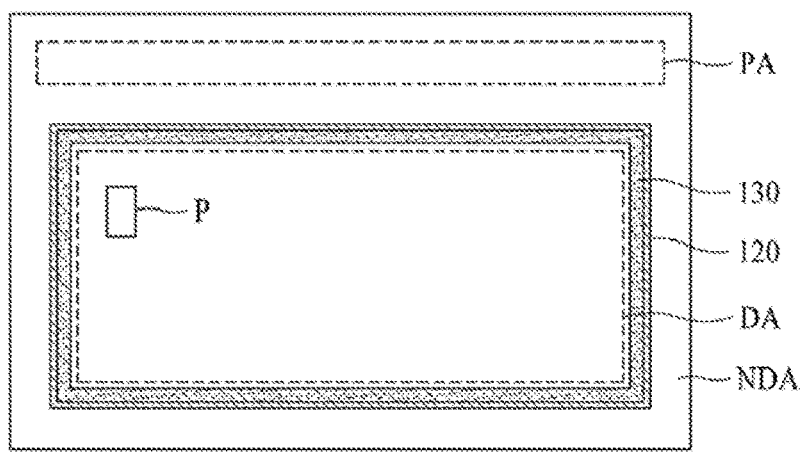
FIG. 12 is a plane view illustrating further still another example of a first substrate of FIG. 4.

FIG. 12 is a plane view illustrating further still another example of the first substrate of FIG. 4.

Referring to FIG. 12, the first substrate 111 is categorized into the display area DA and the non-display area NDA, wherein the pad area PA where pads are formed, the dam 120 and the conductive testing line 130 may be formed on the non-display area NDA. In this case, the first substrate 111 shown in FIG. 12 is different from the first substrate shown in FIG. 5 in that the conductive testing line 130 is arranged between the display area DA and the dam 120.

The dam 120 is arranged between the display area DA and the pad area PA to shield the flow of the organic film 292 constituting the encapsulation film 290 of the pixel P, thereby preventing the organic film 292 from being permeated into the pad area PA.

The conductive testing line 130 is arranged between the display area DA and the dam 120 and used to detect that the organic film 292 constituting the encapsulation film 290 of the pixel P is not formed to reach an inner side of the dam 120.

The organic film 292 is preferably formed at a sufficient thickness to prevent particles from being permeated into the organic light emitting layer 282 and the first electrode 283 by passing through the first inorganic film 291. However, if the organic film 292 is not formed to reach the inner side of the dam 120, the particles may be permeated into the organic light emitting layer 282 and the first electrode 283 by passing through the first inorganic film 291. To avoid this, the conductive testing line 130 arranged between the display area DA and the dam 120 may be used to detect whether the organic film 202 has been formed to reach the inner side of the dam 120.

Figure 13:
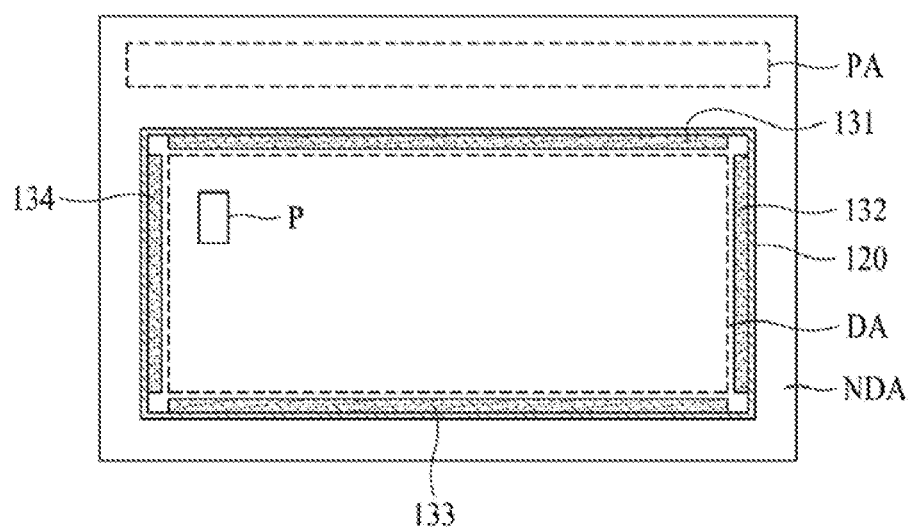
FIG. 13 is a plane view illustrating further still another example of a first substrate of FIG. 4.

FIG. 13 is a plane view illustrating further still another example of the first substrate of FIG. 4.

Referring to FIG. 13, the first substrate 111 is categorized into the display area DA and the non-display area NDA, wherein the pad area PA where pads are formed, the dam 120 and the conductive testing line 130 may be formed on the non-display area NDA. In this case, the first substrate 111 shown in FIG. 13 is different from the first substrate shown in FIG. 5 in that the conductive testing line 130 includes a plurality of conductive testing lines arranged between the display area DA and the dam 120.

The dam 120 is arranged to surround four sides of the display area DA, thereby shielding a flow of the organic film 292 constituting the encapsulation film 290 of the pixel P. As a result, the dam 120 prevents the organic film 292 from being permeated into the pad area PA and at the same time prevents the organic film 292 from being exposed to the outside of the display device.

The conductive testing line 130 includes first to fourth conductive testing lines 131, 132, 133 and 134 respectively arranged at the four sides of the display area DA. At this time, the first to fourth conductive testing lines 131, 132, 133 and 134 are spaced apart from one another and are not electrically connected with one another.

Each of the first to fourth conductive testing lines 131, 132, 133 and 134 is arranged inside the dam 120 and used to detect that the organic film 292 constituting the encapsulation film 290 of the pixel P overflows outside the dam 120.

FIGS. 14A to 14G are cross-sectional views illustrating a testing method of a display device according to one embodiment of the present disclosure.

Figure 14A:
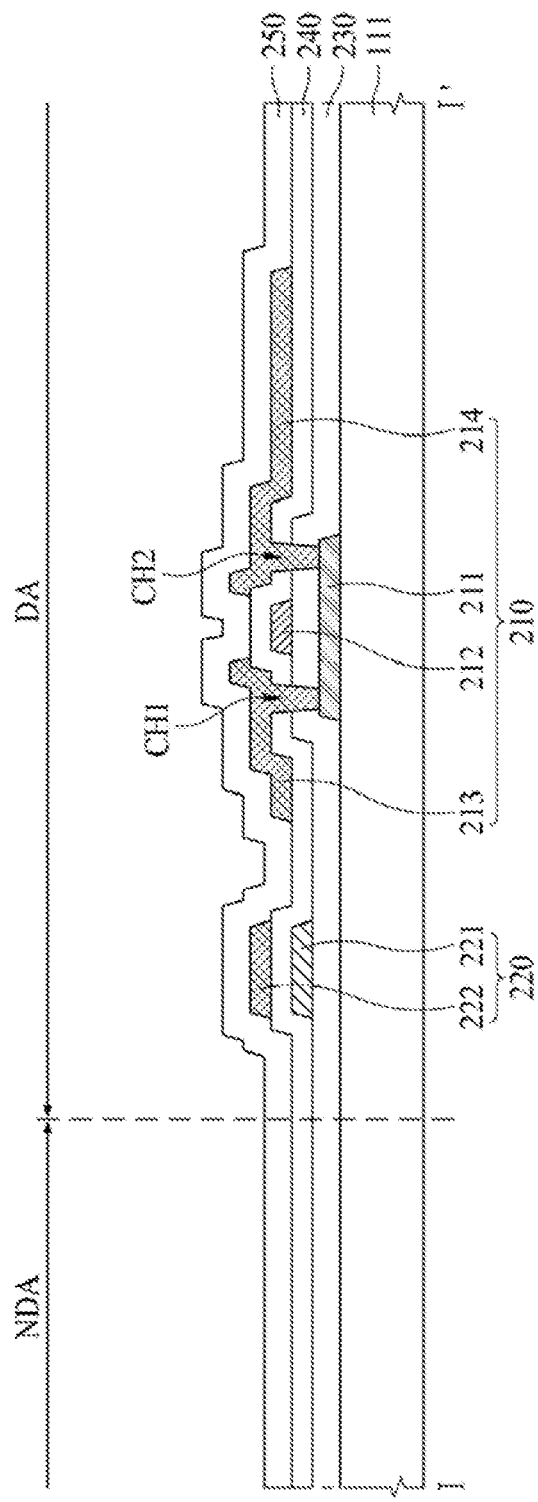
FIGS. 14A to 14G are cross-sectional views illustrating a testing method of a display device according to one embodiment of the present disclosure.

First of all, as shown in FIG. 14A, the thin film transistor 210 and the capacitor 220 are formed.

In more detail, the active layer 211 is formed on the first substrate 111. The active layer 211 may be formed of a silicon based semiconductor material or an oxide based semiconductor material.

Then, the gate insulating film 230 is formed on the active layer 211. The gate insulating film 230 may be formed of an inorganic film, for example, a silicon oxide film, a silicon nitride film or a multi-layered film of the silicon oxide film and the silicon nitride film.

The gate electrode 212 and the lower electrode 221 of the capacitor 220 are formed on the gate insulating film 230. The gate electrode 212 and the lower electrode 221 may be, but not limited to, a single layer or multi-layer comprised of any one of Mo, Al, Cr, Au, Ti, Ni, Nd and Cu or their alloy.

Afterwards, the dielectric inter-layer 240 is formed on the gate electrode 212 and the lower electrode 221. The dielectric inter-layer 240 may be formed of an inorganic film, for example, a silicon oxide film, a silicon nitride film or a multi-layered film of the silicon oxide film and the silicon nitride film.

Then, the contact holes CH1 and CH2 for exposing the active layer 212 are formed to pass through the gate insulating film 230 and the dielectric inter-layer 240.

The source electrode 213, the drain electrode 214, and the upper electrode 222 of the capacitor 220 are formed on the dielectric inter-layer 240. Each of the source electrode 213, the drain electrode 214 and the upper electrode 222 may be, but not limited to, a single layer or multi-layer comprised of any one of Mo, Al, Cr, Au, Ti, Ni, Nd and Cu or their alloy.

The passivation film 250 is formed on the thin film transistor 210 and the capacitor 220. The passivation film 250 may serve as an insulating film. The passivation film 250 may be formed of an inorganic film, for example, a silicon oxide film, a silicon nitride film or a multi-layered film of the silicon oxide film and the silicon nitride film.

Figure 14B:
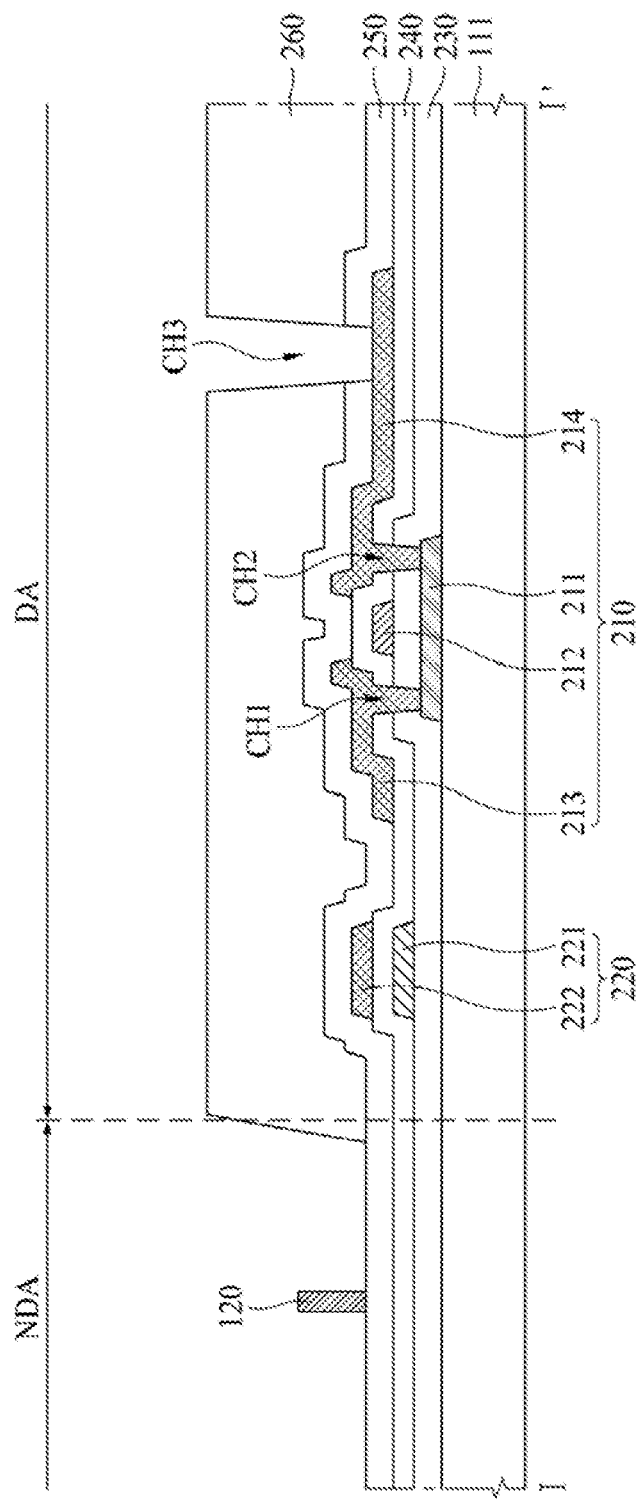

Next, as shown in FIG. 14B, the planarization film 260 and the dam 120 are formed.

In more detail, the planarization film 260 and the dam 120 are formed on the passivation film 250. Each of the planarization film 260 and the dam 120 may be formed of an organic film such as acrylic resin, epoxy resin, phenolic resin, polyamide resin, and polyimide resin.

Then, the contact hole CH3 for exposing the source or drain electrode 214 of the thin film transistor 210 is formed to pass through the passivation film 250 and the planarization film 260.

Although FIG. 14B illustrates that the dam 120 is formed simultaneously with the planarization film 260, the dam 120 may be formed simultaneously with the passivation film 250 or the bank 284, which is formed later, in another embodiment.

Figure 14C:
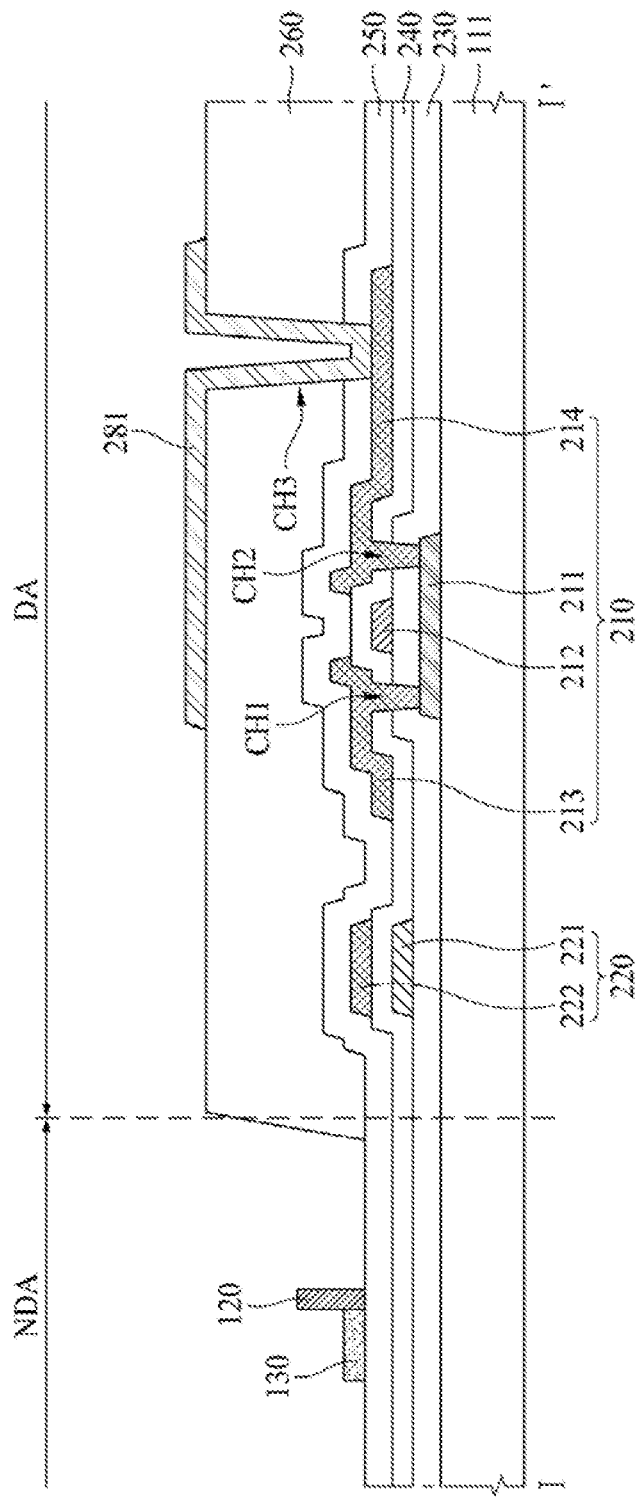

Next, as shown in FIG. 14C, the second electrode 281 and the conductive testing line 130 are formed. Each of the second electrode 281 and the conductive testing line 130 may be formed of a metal material having high reflectivity such as a deposition structure (Ti/Al/Ti) of Al and Ti, a deposition structure (ITO/Al/ITO) of Al and ITO, an APC alloy, and a deposition structure (ITO/APC/ITO) of APC alloy and ITO. The APC alloy is an alloy of Ag, Pd and Cu.

Although FIG. 14C illustrates that the conductive testing line 130 is formed simultaneously with the second electrode 281, the conductive testing line 130 may be formed simultaneously with the first electrode 283, which is formed later, in another embodiment.

Figure 14D:
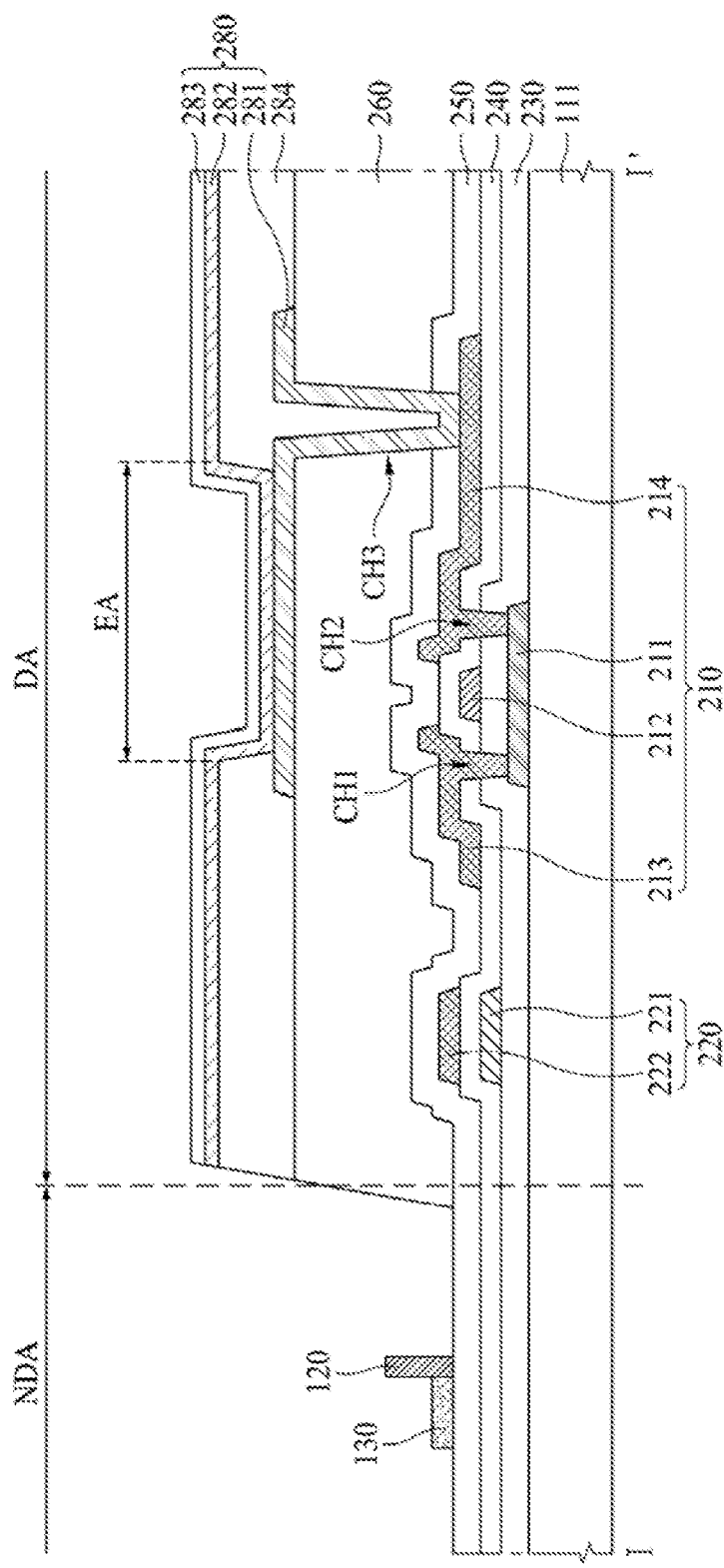

Next, as shown in FIG. 14D, the bank 284, the organic light emitting layer 282 and the first electrode 283 are formed.

In more detail, the bank 284 is formed on the planarization film 260 to cover an edge of the second electrode 281, thereby partitioning the emission areas EA. The bank 284 may be formed of an organic film such as acrylic resin, epoxy resin, phenolic resin, polyamide resin, and polyimide resin.

Then, the organic light emitting layer 282 is formed on the second electrode 281 and the bank 284.

Then, the first electrode 283 is formed on the organic light emitting layer 282. The first electrode 283 may be formed of a transparent conductive material (TCO) such as ITO and IZO, which may transmit light, or a semi-transmissive conductive material such as Mg, Ag, or alloy of Mg and Ag. The capping layer may be formed on the first electrode 283.

Figure 14E:
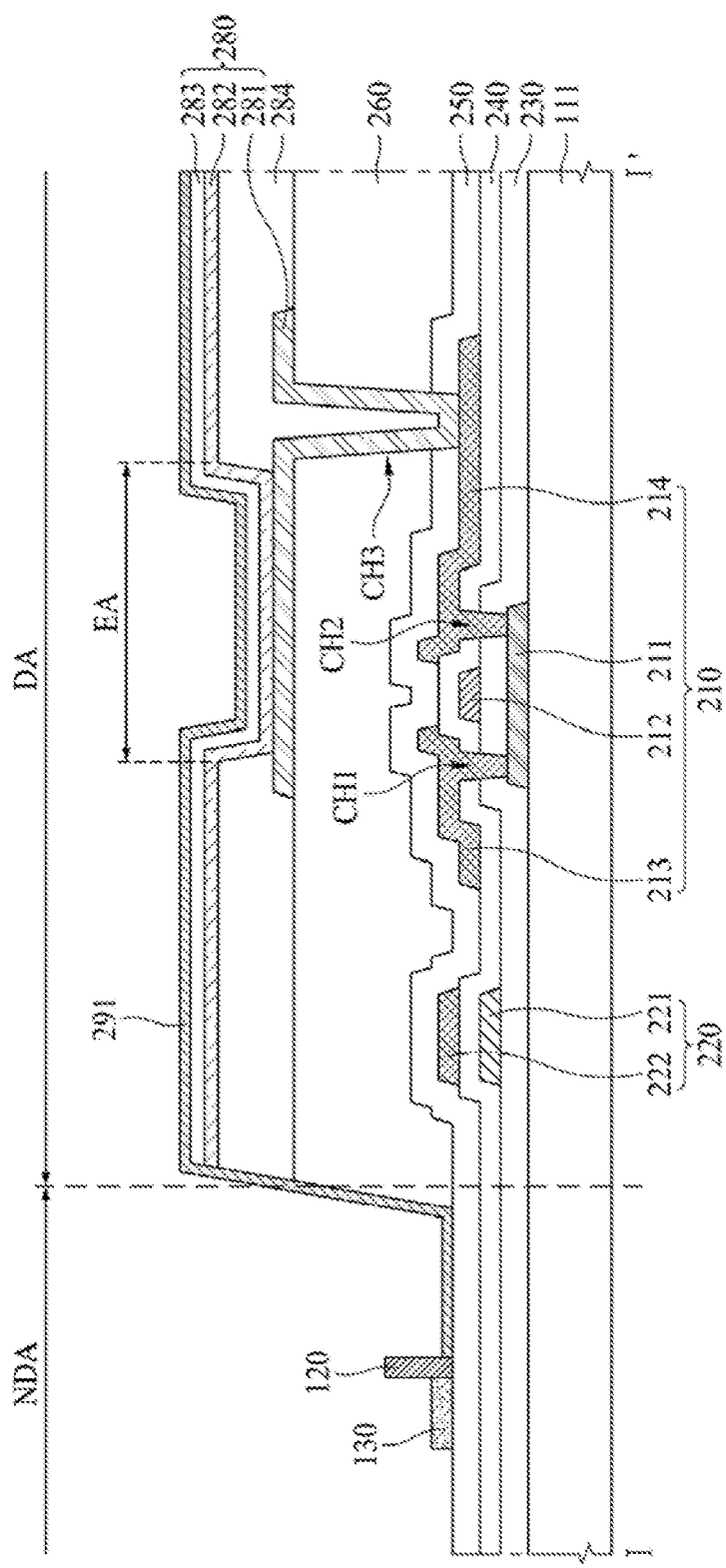

Next, as shown in FIG. 14E, the first inorganic film 291 is formed to cover the display area and at the same not to cover the dam 120. The first inorganic film 291 may be formed of a silicon nitride, an aluminum nitride, a zirconium nitride, a titanium nitride, a hafnium nitride, a tantalum nitride, silicon nitride, an aluminum oxide, or a titanium oxide.

Figure 14F:
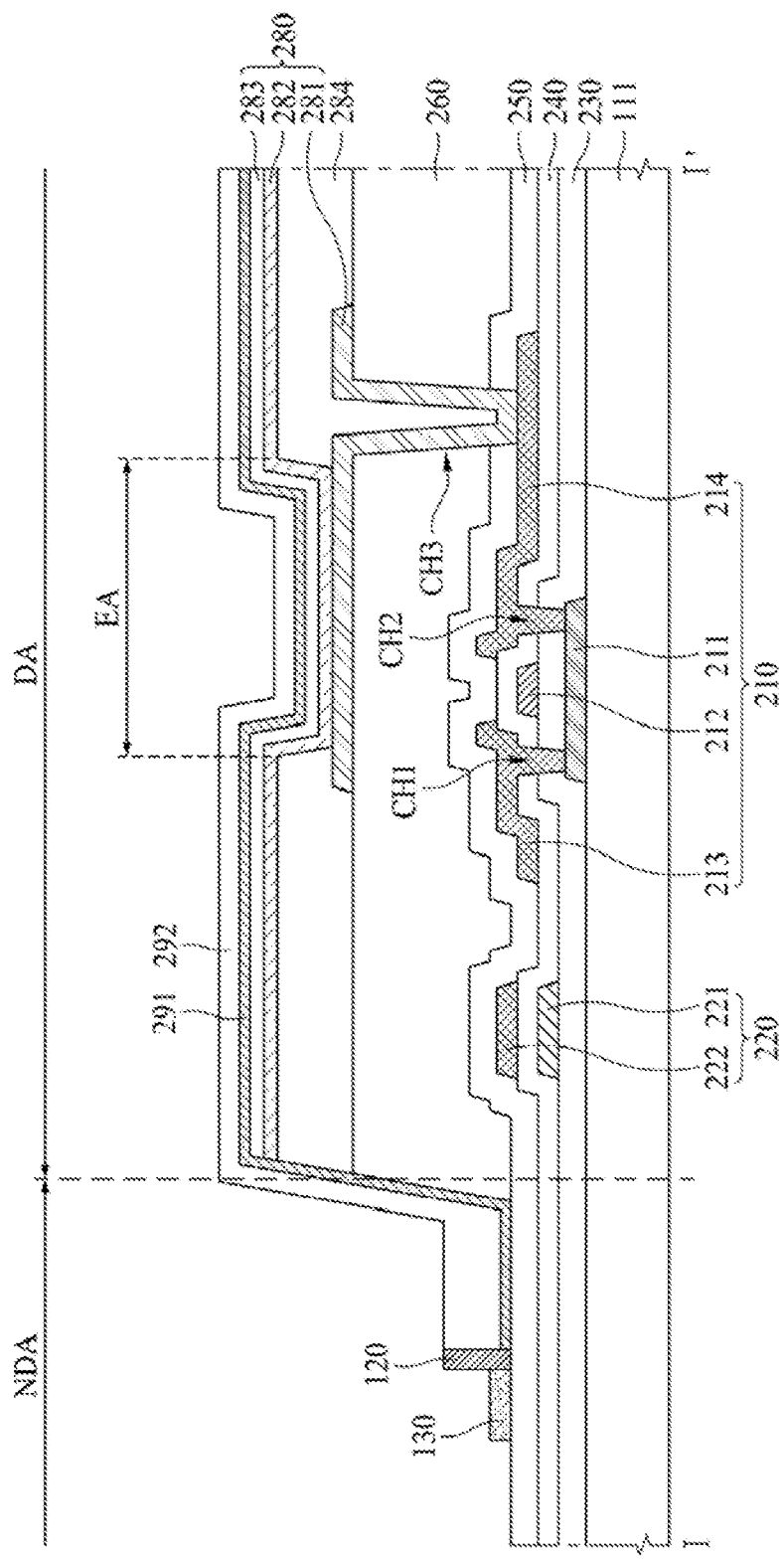

Next, as shown in FIG. 14F, the organic film 292 is formed to cover the first inorganic film 291 and at the same time not to cover the dam 120. The organic film 292 may be formed of an organic material, which may transmit light emitted from the organic light emitting layer 282 at 99% or more, for example, acrylic resin, epoxy resin, phenolic resin, polyamide resin, or polyimide resin.

Then, a current or resistance of at least two points of the conductive testing line 130 is measured to detect a defect.

In more detail, the external measurement device 180 applies an electric signal to a first point A and a second point B of the conductive testing line by using a plurality of probes, and measures the current or resistance between the first point A and the second point B.

At this time, if the measured current or resistance is equal to or less than a threshold value, which would indicate that some portion of the organic film 292 is formed on the conductive testing line 130, the corresponding display device is determined as a defective product. On the other hand, if the measured current or resistance exceeds the threshold value (i.e., indicating that no organic film 292 is in contact with the conductive testing line 130), the corresponding display device is determined as a good product.

Hereinafter, a method for testing a defect using the conductive testing line 130 will be described in more detail with reference to FIGS. 15 and 16.

Figure 15:
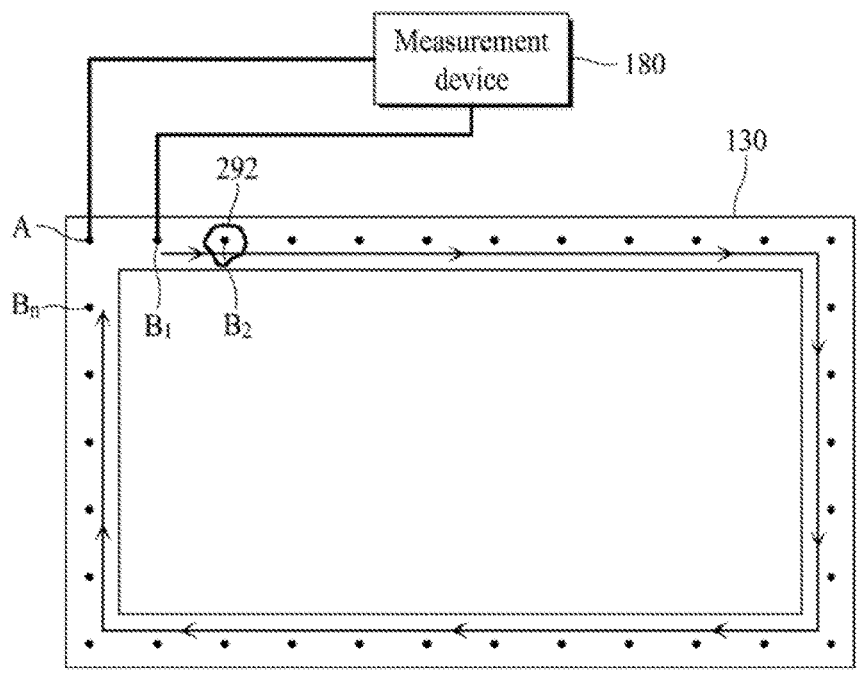
FIG. 15 is a view illustrating an example of a method for testing a defect using a conductive testing line.

FIG. 15 is a view illustrating an example of a method for testing a defect using a conductive testing line.

If the conductive testing line 130 is formed to surround the outside of the display area DA, the external measurement device 180 may fix the first probe to the first point A of the conductive testing line 130 and move the second probe at a predetermined interval along the conductive testing line 130 to test a defect.

In more detail, the external measurement device 180 arranges the first probe at the first point A of the conductive testing line 130, and arranges the second probe at the second point B1 having a predetermined interval from the first point A. Also, the external measurement device 180 applies an electric signal to the first point A and the second point B1 of the conductive testing line 130, and measures the current or resistance between the first point A and the second point B1.

At this time, if the measured current or resistance is a threshold value or less, since the organic film 292 is formed on the conductive testing line 130, the corresponding display device is determined as a defective product.

On the other hand, if the measured current or resistance exceeds a threshold value, the external measurement device 180 moves the second probe at a predetermined interval and arranges the second probe at the second point B2. Also, the external measurement device 180 applies an electric signal to the first point A and the second point B2 of the conductive testing line 130, and measures the current or resistance between the first point A and the second point B2.

At this time, if the measured current or resistance is a threshold value or less, since the organic film 292 is formed on the conductive testing line 130, the corresponding display device is determined as a defective product. For example, if the organic film 292 is formed at the second point B2 of the conductive testing line 130 as shown in FIG. 15, a value of the current or resistance between the first point A and the second point B2, which is close to 0, may be measured.

On the other hand, if the measured current or resistance exceeds a threshold value, the external measurement device 180 moves the second probe at a predetermined interval and arranges the second probe at the second point B3.

The external measurement device 180 ends testing if the second probe moves along the conductive testing line 130 and is arranged at the first point A, and determines the corresponding display device as a good product.

In the present disclosure, the first point A of the conductive testing line 130 is fixed and the second point B of the conductive testing line 130 moves at a predetermined interval along the conductive testing line 130 to test a defect, whereby a defect test can be performed more exactly.

Figure 16:
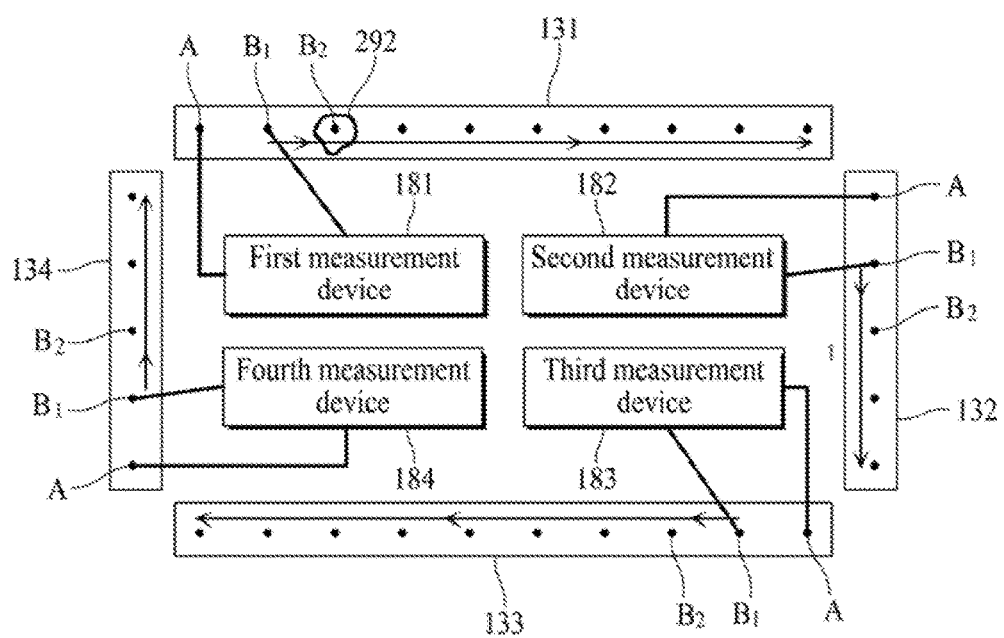
FIG. 16 is a view illustrating another example of a method for testing a defect using a conductive testing line.

FIG. 16 is a view illustrating another example of a method for testing a defect using a conductive testing line.

If the conductive testing line 130 includes first to fourth conductive testing lines 131, 132, 133 and 134 respectively arranged at four sides of the display area DA, the external measurement device 180 may test the first to fourth conductive testing lines 131, 132, 133 and 134 at the same time. Although FIG. 16 illustrates that the external measurement device 180 includes first to fourth measurement devices 181, 182, 183 and 184 corresponding to the first to fourth conductive testing lines 131, 132, 133 and 134, the present disclosure is not limited to the example of FIG. 16. In another embodiment, one measurement device 180 may be implemented physically.

The first measurement device 181 may fix the first probe to the first point A of the first conductive testing line 131 and move the second probe at a predetermined interval along a length of the first conductive testing line 131 to test a defect.

In more detail, the first measurement device 181 arranges the first probe at the first point A of the first conductive testing line 131, and arranges the second probe at the second point B1 having a predetermined interval from the first point A. The first measurement device 181 applies an electric signal to the first point A and the second point B1 of the first conductive testing line 131, and measures the current or resistance between the first point A and the second point B1.

At this time, if the measured current or resistance is a threshold value or less, since the organic film 292 is formed on the first conductive testing line 131, the corresponding display device is determined as a defective product.

On the other hand, if the measured current or resistance exceeds a threshold value, the first measurement device 181 moves the second probe at a predetermined interval and arranges the second probe at the second point B2. Also, the first measurement device 181 ends testing if the second probe gets out of the length of the first conductive testing line 131.

The second measurement device 182 may fix the first probe to the first point A of the second conductive testing line 132 and move the second probe at a predetermined interval along a length of the second conductive testing line 132 to test a defect.

In more detail, the second measurement device 182 arranges the first probe at the first point A of the second conductive testing line 132, and arranges the second probe at the second point B1 having a predetermined interval from the first point A. The second measurement device 182 applies an electric signal to the first point A and the second point B1 of the second conductive testing line 132, and measures the current or resistance between the first point A and the second point B1.

At this time, if the measured current or resistance is a threshold value or less, since the organic film 292 is formed on the second conductive testing line 132, the corresponding display device is determined as a defective product.

On the other hand, if the measured current or resistance exceeds a threshold value, the second measurement device 182 moves the second probe at a predetermined interval and arranges the second probe at the second point B2. The second measurement device 182 ends testing if the second probe gets out of the length of the second conductive testing line 132.

The third measurement device 183 may fix the first probe to the first point A of the third conductive testing line 133 and move the second probe at a predetermined interval along a length of the third conductive testing line 133 to test a defect.

In more detail, the third measurement device 183 arranges the first probe at the first point A of the third conductive testing line 133, and arranges the second probe at the second point B1 having a predetermined interval from the first point A. The third measurement device 183 applies an electric signal to the first point A and the second point B1 of the third conductive testing line 133, and measures the current or resistance between the first point A and the second point B1.

At this time, if the measured current or resistance is a threshold value or less, since the organic film 292 is formed on the third conductive testing line 133, the corresponding display device is determined as a defective product.

On the other hand, if the measured current or resistance exceeds a threshold value, the third measurement device 183 moves the second probe at a predetermined interval and arranges the second probe at the second point B2. The third measurement device 183 ends testing if the second probe gets out of the length of the third conductive testing line 133.

The fourth measurement device 184 may fix the first probe to the first point A of the fourth conductive testing line 134 and move the second probe at a predetermined interval along a length of the fourth conductive testing line 134 to test a defect.

In more detail, the fourth measurement device 184 arranges the first probe at the first point A of the fourth conductive testing line 134, and arranges the second probe at the second point B1 having a predetermined interval from the first point A. The fourth measurement device 184 applies an electric signal to the first point A and the second point B1 of the fourth conductive testing line 134, and measures the current or resistance between the first point A and the second point B1.

At this time, if the measured current or resistance is a threshold value or less, since the organic film 292 is formed on the fourth conductive testing line 134, the corresponding display device is determined as a defective product.

On the other hand, if the measured current or resistance exceeds a threshold value, the fourth measurement device 184 moves the second probe at a predetermined interval and arranges the second probe at the second point B2. Also, the fourth measurement device 184 ends testing if the second probe gets out of the length of the fourth conductive testing line 134.

If the current or resistance measured by at least one of the first to fourth measurement devices 181, 182, 183 and 184 is a threshold value or less, since the organic film 292 is formed on at least one of the first to fourth conductive testing lines 131, 132, 133 and 134, the corresponding display device is determined as a defect product.

On the other hand, if the current or resistance measured by at least one of the first to fourth measurement devices 181, 182, 183 and 184 exceeds a threshold value, the corresponding display device is determined as a good product.

Since the first to fourth conductive testing lines 131, 132, 133 and 134 can be detected at the same time in the testing method shown in FIG. 16, the testing time can be reduced as compared with the testing method shown in FIG. 15.

Figure 14G:
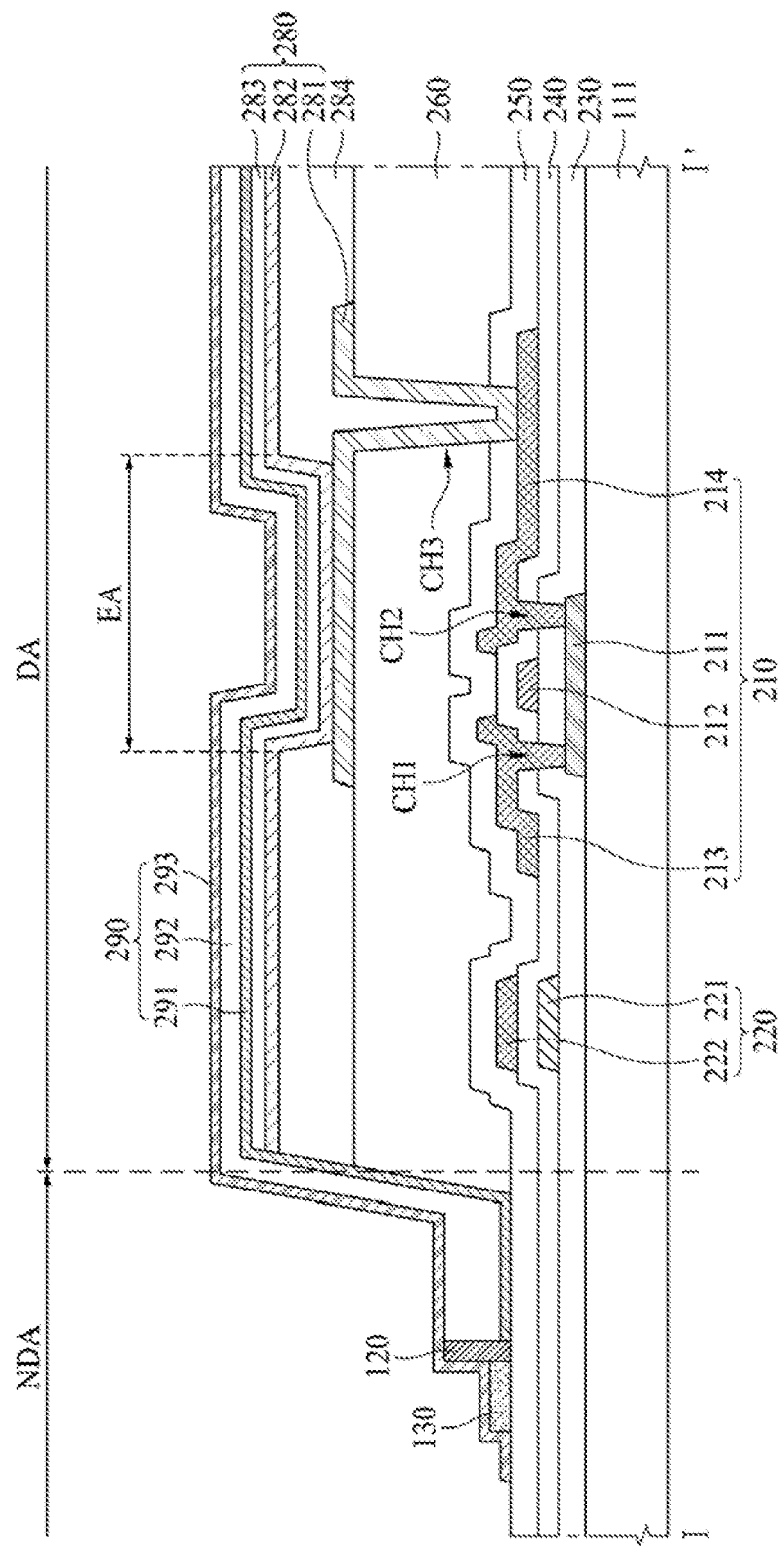

Meanwhile, if the corresponding display device is determined as a good product as the organic film 292 is not formed on the conductive testing line 130, the second inorganic film 293 is formed to cover the organic film 292, the dam 120 and the conductive testing line 130 as shown in FIG. 14G. The second inorganic film 293 may be formed of a silicon nitride, an aluminum nitride, a zirconium nitride, a titanium nitride, a hafnium nitride, a tantalum nitride, silicon nitride, an aluminum oxide, or a titanium oxide.

As described above, according to the present disclosure, the following and various other advantages can be obtained.

The dam is formed between the display area and the pad area to shield the flow of the organic film, whereby the organic film can be prevented from being permeated into the pad area and from being exposed to the outside.

Also, the overflow of the organic film can be detected using the conductive testing line formed between the dam and the pad area. Therefore, degradation of the organic light emitting diode, which is caused as the organic film is exposed without being fully covered by the inorganic film, can be avoided.

Also, exactness in detecting a defect can be enhanced and at the same time reliability of the product can be improved.

Also, the dam is formed of the same material as that of the planarization film or the bank, and the conductive testing line is formed of the same material as that of the anode electrode or the cathode electrode, whereby a separate manufacturing process is not required additionally.

Also, the first to fourth conductive testing lines can be tested at the same time, whereby the testing time can be reduced.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents. Thus, the above embodiments are to be considered in all respects as illustrative and not restrictive. The scope of the disclosure should be determined by reasonable interpretation of the appended claims and all change which comes within the equivalent scope of the disclosure are included in the scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a substrate including a display area where pixels are arranged, and a pad area including a plurality of pads formed outside the display area;
an encapsulation film covering the display area, the encapsulation film including at least one inorganic film and at least one organic film;
a first dam arranged between the display area and the pad area; and
a conductive testing line arranged between the first dam and the pad area,
wherein the conductive testing line is electrically isolated from any other conductive lines or electrodes formed on the substrate.

2. The display device of claim 1, wherein the encapsulation film includes:
a first inorganic film covering the display area;
an organic film covering the first inorganic film; and
a second inorganic film covering the organic film,
wherein the first inorganic film does not cover the conductive testing line.

3. The display device of claim 2, wherein the second inorganic film covers the first dam and the conductive testing line.

4. The display device of claim 1, wherein the first dam and the conductive testing line are arranged to surround the display area.

5. The display device of claim 1, wherein the first dam is arranged to surround four sides of the display area, the conductive testing line includes first, second, third and fourth conductive testing lines respectively arranged along the four sides of the display area, and the first, second, third and fourth conductive testing lines are arranged to be spaced apart from one another and electrically isolated with respect to one another.

6. The display device of claim 1, further comprising a second dam arranged between the first dam and the pad area.

7. The display device of claim 6, wherein the conductive testing line is arranged between the first dam and the second dam.

8. The display device of claim 1, wherein the conductive testing line is arranged between the first dam and the display area.

9. The display device of claim 1, wherein each of the pixels includes an organic light emitting diode that includes an anode electrode and a cathode electrode, and the conductive testing line is made of the same material as that of at least one of the anode electrode and the cathode electrode.

* * * * *